United States Patent [19]

Kovacs et al.

[11] Patent Number: 5,576,752
[45] Date of Patent: Nov. 19, 1996

[54] OFFSET MOUNTING OF NONMONOLITHIC MULTIWAVELENGTH LASERS

[75] Inventors: Gregory J. Kovacs, Sunnyvale; R. Donald Yingling, Jr. deceased, late of San Francisco, by David Williamson executor; Tibor Fisli, Los Altos Hills, all of Calif.

[73] Assignee: Xerox Corporation, Stamford, Conn.

[21] Appl. No.: 156,219

[22] Filed: Nov. 22, 1993

[51] Int. Cl.$^6$ .................... B41J 2/45; H01S 3/19
[52] U.S. Cl. .................... 347/238; 372/50
[58] Field of Search .................... 347/241, 238, 347/239, 43; 359/204, 18; 372/50, 18, 36, 45, 50

[56] References Cited

U.S. PATENT DOCUMENTS

| | | | |
|---|---|---|---|
| 4,716,568 | 12/1987 | Scifres et al. | 372/36 |
| 4,786,918 | 11/1988 | Thornton et al. | 347/239 |
| 4,901,325 | 2/1990 | Kato et al. | 372/44 |
| 5,170,180 | 12/1992 | Doi | 347/232 |
| 5,243,359 | 7/1993 | Fisli | 346/1.1 |
| 5,371,526 | 12/1994 | Appel et al. | 347/239 |
| 5,398,052 | 3/1995 | Isaka et al. | 347/233 |

*Primary Examiner*—Benjamin R. Fuller
*Assistant Examiner*—Thinh Nguyen
*Attorney, Agent, or Firm*—John M. Kelly; William Pryz

[57] ABSTRACT

A nonmonolithic, multiple wavelength laser array having closely spaced lasing elements which are accurately spaced both in a plane perpendicular to the optical axes of the laser beams and along the optical axes. The laser array includes a plurality of lasing elements mounted on a high thermal conductivity spacer. The spacer has a front surface angled relative to the optical axes of the lasing elements, and parallel mounting surfaces. The mounting surfaces and front surfaces join to form front edges. The laser elements mount such that the front facet of each lasing element is aligned with an associated front edge. Beneficially, either the spacer is electrically conductive, or the spacer is coated with a layer of conductive material.

The laser array can be used in a printer to offset the laser elements to correct for the wavelength dependency of the printer's optical system.

18 Claims, 5 Drawing Sheets

OFFSET MOUNTING OF NONMONOLITHIC MULTIWAVELENGTH LASERS

The present invention generally relates to nonmonolithic, multiple wavelength laser sources and their applications.

BACKGROUND OF THE PRESENT INVENTION

Laser arrays of multiple wavelength sources have many important applications. For example, a color xerographic printer that uses four different wavelength laser beams can have significantly higher throughput than a color xerographic printer that uses only one laser beam. This is so because a four wavelength laser printer can produce overlapping beams, sweep those beams using a single raster output polygon scanner and a single set of optics, subsequently separate the individual beams using wavelength selective filters, and direct each beam onto a separate xerographic imaging station. A latent image for each wavelength is then developed and a full color image is obtained by transferring the developed images onto a single recording medium. In another application, multiple wavelength overlapping beams are imaged without separation at a single imaging station. Once gain, the multiple beams allow higher throughput than a single beam.

A diode laser package with closely spaced emitters would allow a single set of optics to be used, and would eliminate the need for beam combining optics. However, the individual laser diodes in such a package should be closely spaced (preferably within 200 μm) to avoid off-axis distortion effects as the beams propagate through the optical system.

While multiple wavelength laser sources are advantageous, the use of multiple wavelengths creates its own set of problems. For example, the focal length of a laser beam through a given set of optics is wavelength dependent. Thus, if a single set of optics is used in a multiple wavelength system, the different wavelength laser beams will have different focal lengths. In a printer, different focal lengths will result in multiple focal planes for the imaged spots if all laser beams emanate from the same plane. Different focal positions cause various registration problems and are highly undesirable.

One approach to obtaining similarly dimensioned spots is to offset the various laser sources along the optical axes of the overlapped beams such that all beams produce focus in the same plane on their respective photoreceptor(s). In monolithic laser arrays such optical axis offsets are difficult to achieve. However, nonmonolithic laser arrays can be easily offset along the optical axis.

A problem with nonmonolithic laser arrays is the difficulty of mounting the individual lasing elements accurately and closely together. Such mounting becomes even more difficult if, as frequently is the case, electrical, optical, and thermal crosstalk between the individual laser elements must be avoided (or at least reduced to small levels). Adding the requirement of accurate offsets along the optical axis only further complicates the general mounting problem.

Thus, there exists a need for nonmonolithic laser arrays, and techniques that enable such arrays, that have accurately and closely spaced lasing elements, that have low electrical, optical, and thermal crosstalk, and that permit the individual lasing elements to be accurately offset along the optical axis of the system.

SUMMARY OF THE INVENTION

The present invention provides for nonmonolithic laser arrays with accurately and closely spaced lasing elements (beneficially which output different wavelengths); that have low electrical, optical, and thermal crosstalk between those elements; and that have their individual lasing elements offset along the optical axis. When used in a printer, such laser arrays can be used to locate the front facets of the laser elements at the correct focal point with respect to the optical system such that all spots are focussed in the same plane on the photoreceptor(s), even when the lasing elements output different wavelength beams.

The subject laser array includes a spacer that horizontally separates a plurality of lasing elements which mount on the spacer (beneficially p-side down) on mounting surfaces. The spacer has a front edge that is cut at an angle relative to the direction of optical propagation such that the displacements of the front edges correspond to the required offsets. The laser elements mount on the mounting surfaces such that the front facet of each lasing element is aligned with its associated front edge, thus achieving the required offset.

The spacer is comprised of a thermally conductive material. Heat generated by the lasing elements flows down the spacer and into a base, which is beneficially heatsinked. The spacer conducts heat into the base sufficiently quickly that thermal flow, and thus thermal cross-talk, between the lasing elements is acceptably low.

Beneficially, either the spacer is electrically conductive, or the spacer is coated with a layer of conductive material. Using either method, the spacer provides an electrical path to the lasing elements.

BRIEF DESCRIPTION OF THE DRAWINGS

Other aspects of the present invention will become apparent as the following description proceeds and upon reference to the drawings, in which.

Note that the text includes various directional signals (such as horizontal, vertical, top, bottom, lower, and upper) which are taken relative to the drawings. Those directional signals are meant to aid the understanding of the present invention, not to limit it.

DETAILED DESCRIPTION OF THE ILLUSTRATED EMBODIMENT

Printer Systems

There are many possible architectures for xerographic printing systems. For example, U.S. Pat. No. 5,243,359, issued on Sep. 7, 1992 to Tibor Fisli, which is hereby incorporated by reference, describes a particular four station color printing system which uses a single raster output scanner and a single set of optics. Systems similar to that described in U.S. Pat. 5,243,359 represent an important, but not exhaustive, application of laser arrays that are in accord with the principle of the present invention.

Figure 1:
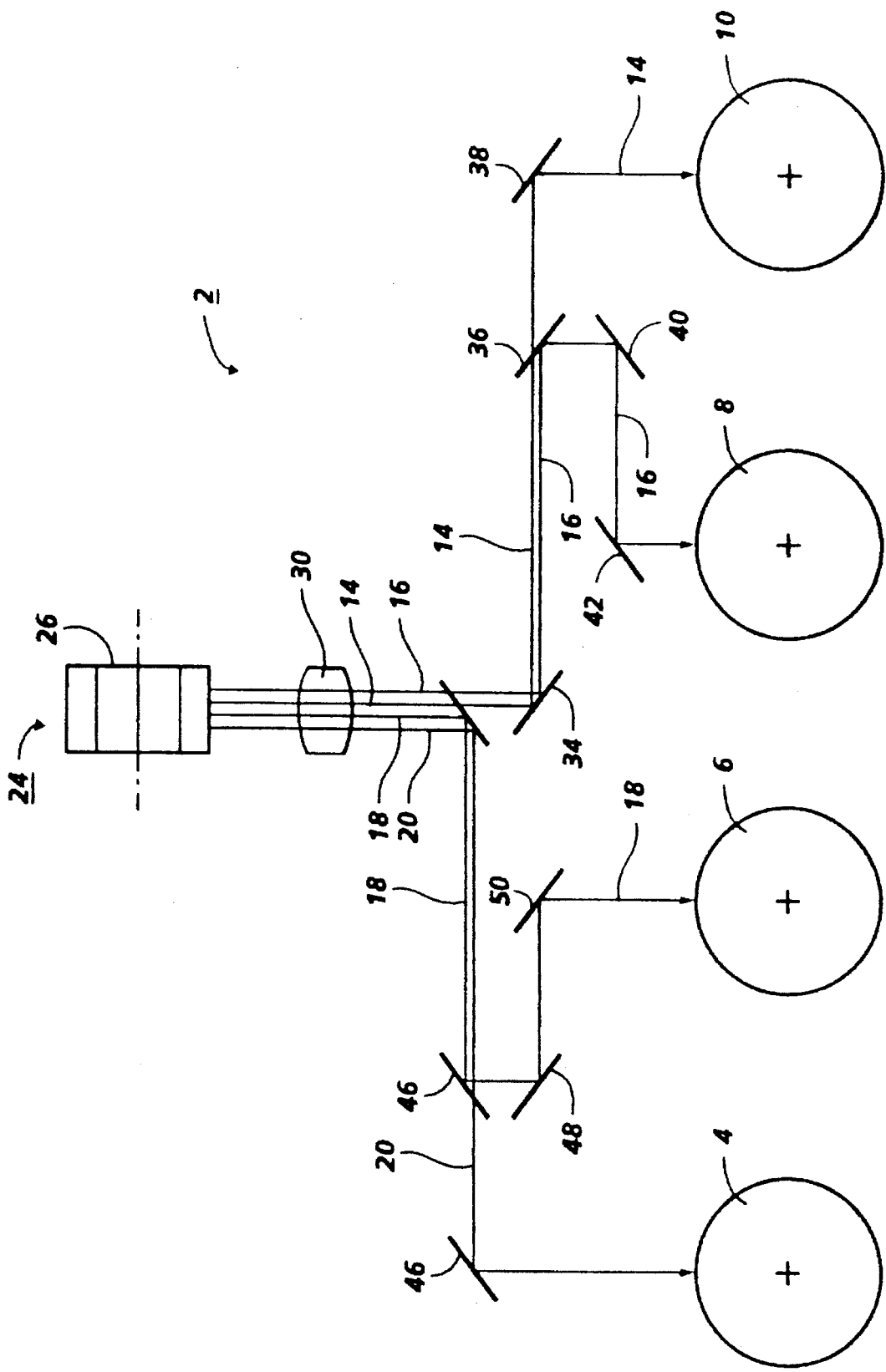
FIG. 1 shows a simplified, partial schematic plan view of a four station color raster output scanner (ROS) system that uses a laser array in accordance with the principles of the present invention.

Refer now to FIG. 1, which illustrates the operation of a multistation color printer 2 that has four photoreceptors (each associated with a xerographic station), designated as photoreceptors 4, 6, 8, and 10. In the printer 2, four bundled, parallel, dissimilar wavelength, and independently modulated laser beams, the beams 14, 16, 18, and 20, are swept by a single rotating polygon mirror 24 having a plurality of facets 26 (also see FIG. 3). The swept beams are input into a single set of imaging and correction optics 30, which focuses the beams and corrects for errors such as polygon angle error and wobble.

The four laser beams from the image and correction optics 30 are input to a first optical filter 32, which is a dichroic mirror (wavelength-selective beam splitter) comprised of a wavelength selective, multi-layer film that passes laser beams 14 and 16, but reflects laser beams 18 and 20. The passed laser beams reflect off of a first mirror 34 onto a second optical filter 36. The second optical filter 36 passes laser beam 14 and reflects laser beam 16. The laser beam 14 then reflects from a second mirror 38 onto the photoreceptor 10, while the laser beam 16 reflects from a third mirror 40 and a fourth mirror 42 onto the photoreceptor 8.

From the first optical filter 32, laser beams 18 and 20 are input to a third optical filter 44. The third optical filter 44 passes laser beam 20 and laser beam 18. The laser beam 20 then reflects from a fifth mirror 46 onto the photoreceptor 4, while the laser beam 18 reflects from a sixth mirror 48 and a seventh mirror 50 onto the photoreceptor 6.

In the multistation color printer 2, the four rotating photoreceptors are the same optical path distance from the polygon mirror 24. Thus, if the laser sources are the same distance from the polygon mirror, the spots produced at the various photoreceptors would focus in different planes relative to the photoreceptor surfaces. Because of various problems, this is highly undesirable. However, the present invention offsets the various laser sources along the direction of the optical axes so that each laser beam produces a spot whose focal plane coincides with the photoreceptor surface.

Figure 2:
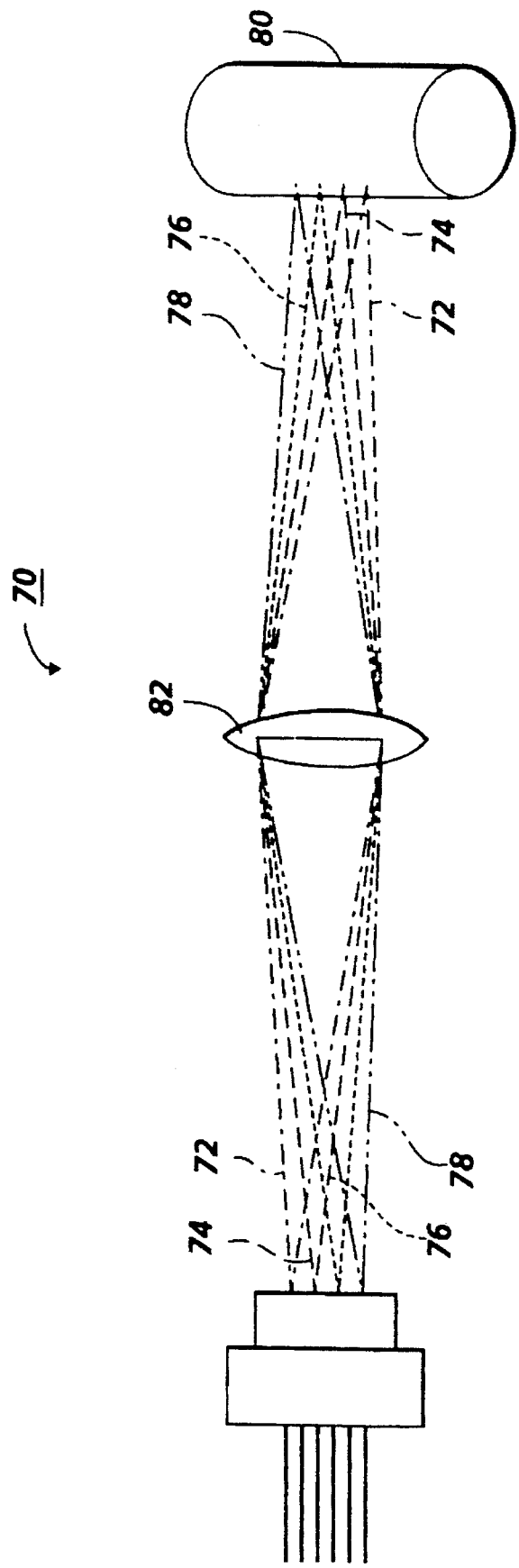
FIG. 2 shows a simplified, schematic perspective view of a single station raster output scanner (ROS) system that uses a laser array in accordance with the principles of the present invention.

An alternate embodiment printer 70 in which arrays in accord with the present invention also find use is illustrated in FIG. 2. The printer 70 is a single station printer wherein four bundled, parallel, dissimilar wavelength, and independently modulated laser beams, the beams being 72, 74, 76, and 78, are imaged onto a single photoreceptor 80. It is to be understood that the printer 70, like the printer 2, uses a single rotating polygon mirror having a plurality of facets to sweep the beams, and a single set of imaging and correction optics which focuses the beams and corrects for errors such as polygon angle error and wobble. For simplicity, in FIG. 2 the mirror and optics are designated as optics 82. However, the printer 70 does not separate the individual beams. Rather, the beams form a set of spots on the photoreceptor 80.

Figure 3:
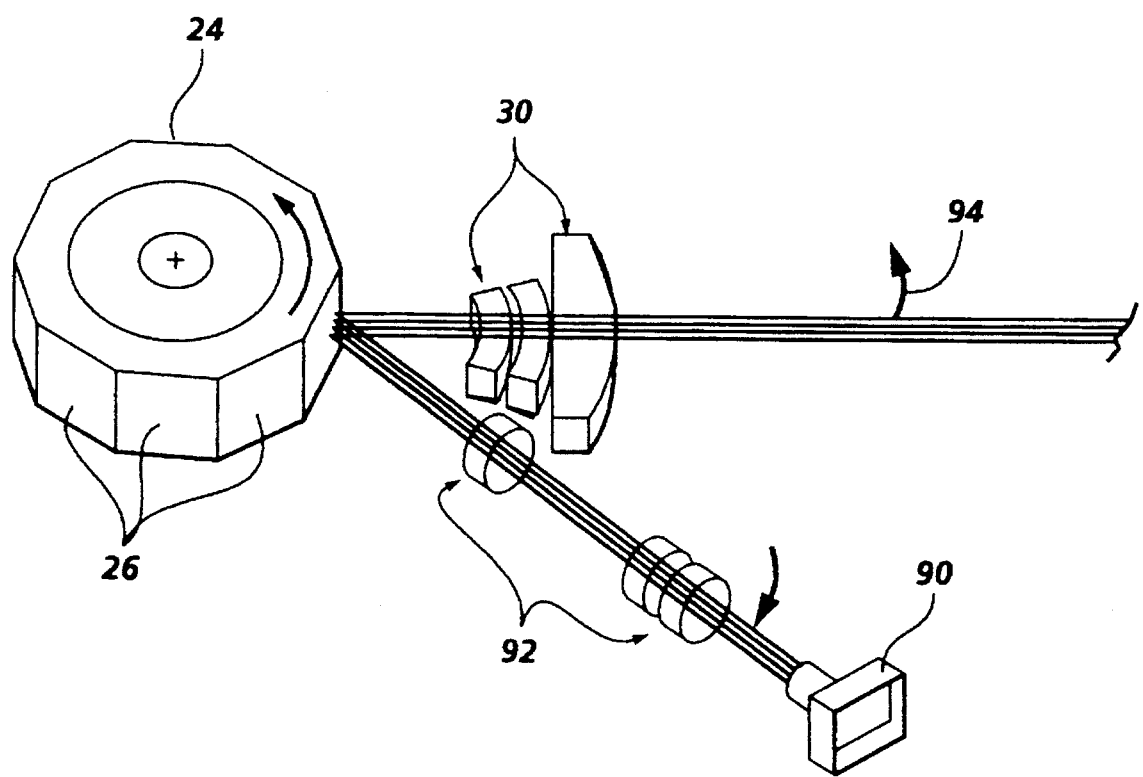
FIG. 3 is a perspective, schematic view which illustrates the orientation of the laser array, the beam forming optics, and the rotating polygon mirror for the systems shown in FIGS. 1 and 2.

In the printer 70, the photoreceptor is at the same total path length from the polygon mirror for each beam. Furthermore, the laser beams share the same optical system. Thus, if the laser sources are the same distance from the polygon mirror, the spots produced on the photoreceptor will be focused in different planes. However, the present invention offsets the various laser sources along the direction of the optical axis so that each laser beam focuses in a common focal plane on the photoreceptor 80. Then, by controlling the modulation of the individual beams, four lines can be imaged simultaneously on the photoreceptor 80. FIG. 3 shows a laser array 90 that produces four different wavelength bundled, parallel, and independently modulated laser beams (the laser beams 14, 16, 18, and 20 in FIG. 1 and the laser beams 72, 74, 76, and 78 in FIG. 2). With either printer 2 or 70, the four laser beams are input to a conventional beam input optical system 92 which directs the beams onto a rotating polygon mirror and an optical system (in FIG. 1, the polygon mirror 24 and image and correction optics 30, in FIG. 2 the optics 82). As the polygon mirror rotates, the reflected beams deflect repeatedly in the direction indicated by the arrow 94 in FIG. 3.

THE LASER ARRAY

Figure 4:
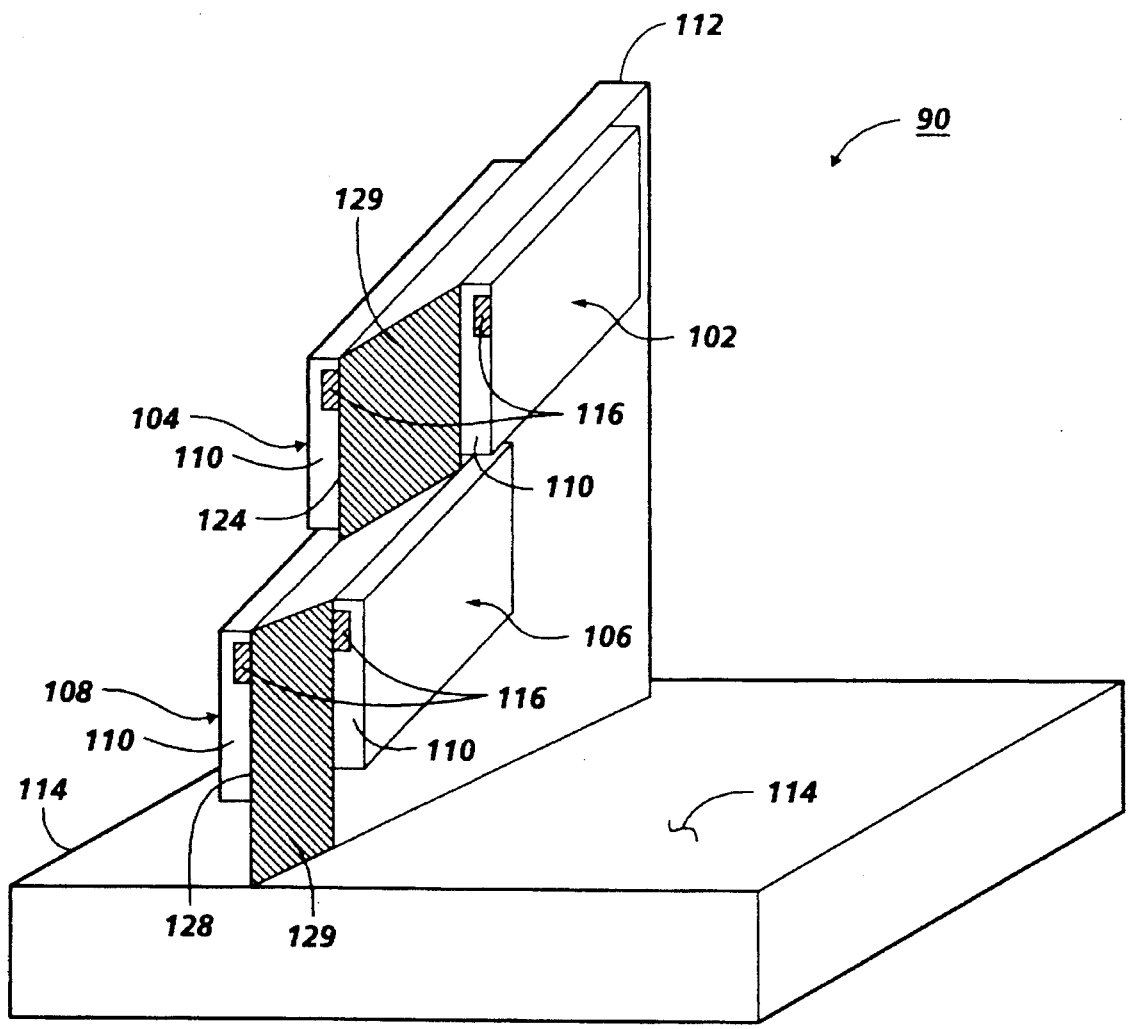
FIG. 4 shows a simplified, schematic perspective view of a laser array that is suitable for use in the ROS system illustrated in FIGS. 1, 2 and 3, and that is in accord with the principles of the present invention.

The laser array 90, shown in detail in FIG. 4, has four laser elements, 102, 104, 106, and 108, each of which outputs a different wavelength (900, 830, 780, and 670 nm, respectively). The laser array 90 is designed to meet the simultaneous requirements of controlled, close spacing of the laser elements in the directions perpendicular to the optical axis, controlled offset of the laser elements along the optical axis direction, and good heatsinking. The offset along the optical axis insures that the front facet 110 of each laser element is at the correct focal position with respect to the input optical system 92 of (FIG. 3) to produce spots that share a common focal plane.

As shown in FIG. 4, the laser array 90 includes an electrically and thermally conductive vertical spacer 112. That spacer has four laser mounting surfaces onto which the various lasing elements mount. Heat generated in the lasing elements is conducted through the spacer into a base 114, which in practice is connected to a thermal sink (not shown). The thermal conductivity of the vertical spacer and the thermally sinked base quickly conduct heat away from the lasing elements, and thus reduce thermal crosstalk.

Still referring to FIG. 4, the individual lasing elements are beneficially mounted such that their individual laser stripes 116 are adjacent the spacer 112 (p-side near the vertical spacer). Mounting in this manner improves the thermal performance of the lasing elements by acting to minimize the thermal resistance from the lasing regions to the thermal sink. If the laser dies from which the lasing elements are formed are cleaved very close to the laser stripes 114, the vertical separation 116 between the laser beams can be made small. Such cleaving is taught in co-pending U.S. patent application D/93627 entitled "Laser Diode Arrays With Close Beam Offset," which is hereby incorporated by reference.

The vertical spacer 112 also provides for electrical communication with the lasing elements. This may be accomplished by fabricating the spacer 112 from an electrically conductive material, such as gold, aluminum, or copper. Alternatively, the spacer may be fabricated from an electrically insulative material, such as intrinsic silicon or diamond, with an electrically conductive layer (again, such as gold, aluminum, or copper) deposited over its outer surface.

Still referring to FIG. 4, laser light is emitted from the laser stripes 116 along parallel optical axes. To achieve parallel axes, the mounting surfaces for the lasing elements are machined parallel to each other. Further, the lasing elements mount flush with a front edge (the edges 122, 124, 126, and 128 of FIG. 4) of the spacer. The front edges define the borders between the front surfaces 129 of the spacer and the various mounting surfaces.

The lasing elements are mounted flush with the front edges. This can be performed visually using a microscope. Thus, the relative locations of the lasing elements along the optical axis can be controlled simply by controlling the positions of the front edges. To control the relative locations of the front edges, the front surfaces 129 of the spacer are cut at angles such that the different positions along the optical axes result in a common focal plane at the photoreceptor(s).

Figure 5:
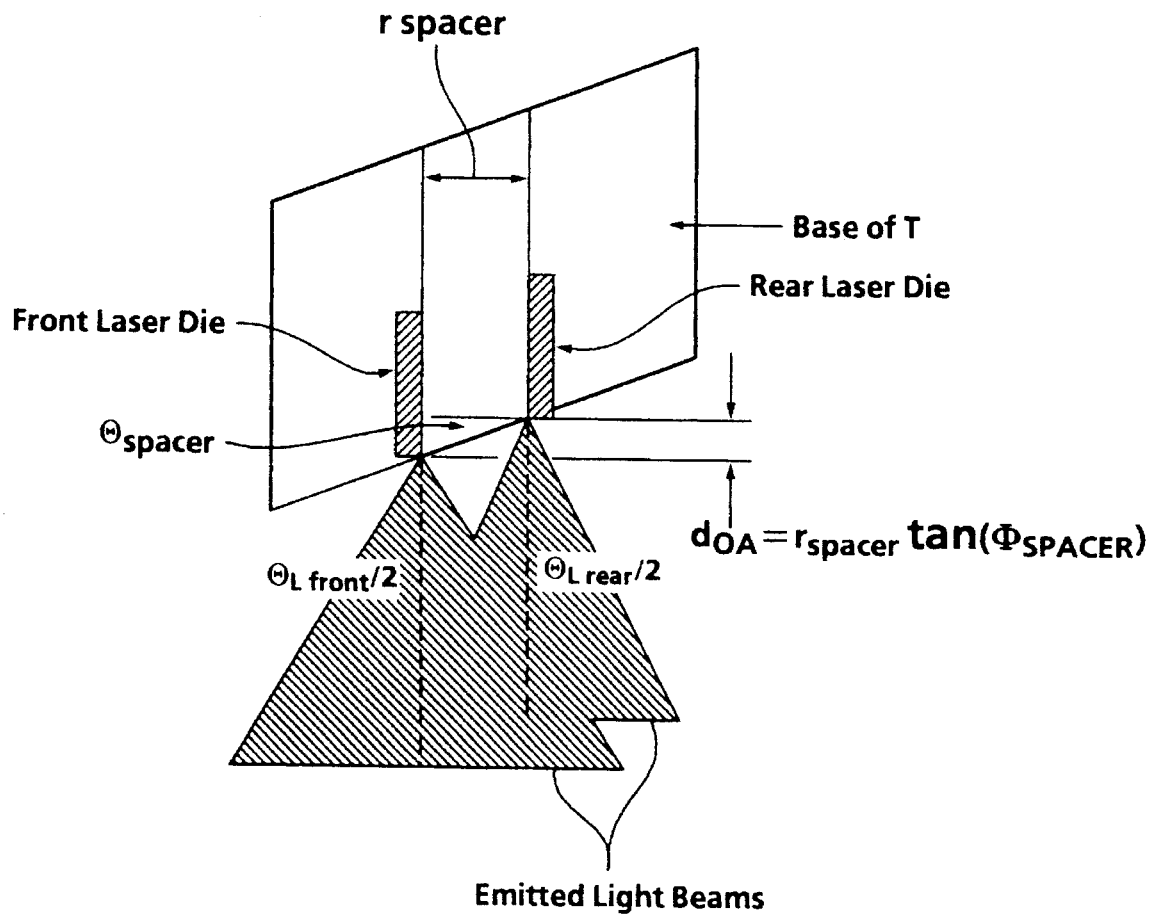
FIG. 5 shows a top down view of the top portion of the laser array of FIG. 4.

In FIG. 5, if $r_{spacer}$ is the width of the spacer, and if $\phi_{spacer}$ is the angle of the front surface with respect to the normal to the optical axis of two horizontally adjacent lasing elements, the optical axis offset of the lasing elements along the optical axis direction, $d_{OA}$, is given by:

$$d_{OA} = r_{spacer} \cdot \tan(\phi_{spacer})$$

FIG. 5 illustrates an important limitation of the embodiment illustrated in FIG. 4. For a desired optical axis offset, $d_{OA}$, and for a rear lasing element having a horizontal plane (Large) beam divergence of $\theta_{Lrear}$, a certain minimum spacer width, $r_{minspacer}$, is required. If that limitation is not meet, the rear laser beam will be clipped by the submount itself. This is of course undesirable and should be avoided. That limitation is given by the following:

$$r_{spacer} > r_{minspacer} = d_{OA} \tan(\theta_{Lrear}/2)$$

In addition to beam clipping between horizontally adjacent lasing elements, beam clipping between the vertically adjacent elements also should be avoided. By analogy to the horizontal case, the conditions to avoid clipping vertically are:

$$r_{vert} > r_{minvert} = d_{vert} \tan(\theta_{Stop}/2) + c_{bottom}$$

where $r_{vert}$ is the perpendicular distance between the centers of the stripes of vertically separated lasing elements, and $c_{bottom}$ is the distance from the cleave edge to the center of the stripe of the bottom laser, and $\theta_{Stop}$ is the vertical plane (Small) beam divergence of the top lasing element.

OPTICAL CONSIDERATIONS

Since the refractive indices of common glasses generally decrease with increasing wavelength, the longer wavelength emitting lasing element of the horizontally adjacent elements will generally need to be further from the input optical system 22 (FIG. 2). Therefore if, for example, the horizontally adjacent lasing elements are of wavelengths 780 nm and 670 nm, the 780 nm laser should be behind the 670 nm lasing element.

Calculations show that typical optical axis offsets are on the order of tens of nanometers. For example, assuming that the input optics 22 has a 11.7631 mm focal length at 670 nm, that same input optics 22 would have focal lengths of 11.8355, 11.8604, and 11.8923 mm at 780, 830, and 900 nm wavelengths, respectively.

FABRICATION OF THE SPACERS

While the spacer 112 may be fabricated from any number of materials, a particularly useful material is silicon. Silicon has the advantages of being easily micro-machined, plus having a relatively high thermal conductivity. A silicon support approximately 4 mil wide and 25 mil high can readily be fabricated using a precision automatic diamond cutter and a milling saw. For example, a spacer similar to that shown in FIG. 3 (but which requires deposition of a conductive layer for electrical conductivity) can be micro-machined from a silicon wafer using a standard automated silicon dicing saw (reference MicroAutomation Model 602M) having special diamond grit resin blades. A "T" column is first made by making 28 mil cuts into the silicon wafer using a 4 mil blade having 9 μm diamond grit. The resulting shape is then formed into a T by milling off the excess column using a 65 mil blade with a 30 μm diamond grit. Lengthwise cuts are then made, followed by crosswise cuts at the desired angle (see the discussion below) to define the front surfaces 129 of the spacer and the edges 122, 124, 126, and 128. Note that if the spacing between the lasing elements 102 and 104 is to be different than that between the lasing elements 106 and 108, additional sawcuts to different depths and spacing are required.

After forming of the silicon spacer, an electrical conductor is deposited over the spacer. The lasing elements are then soldered to the spacer as described below.

SOLDERING THE LASING ELEMENTS ONTO THE SPACER

Attachment of the lasing elements, 102, 104, 106, and 108, to the support 112 is best performed using a low temperature solder, such as In. First, prior to soldering, the indium pellets used for soldering are immersed in a dilute hydrochloric acid solution for oxide removal. Then, the spacer's mounting surfaces are prepared for soldering by sputter deposition of a thin layer of nickel, followed by thin layer of platinum. Solder is then deposited onto the spacers using thermal evaporation of the indium pellets from tungsten boats. The objective is to deposit a film that is thick enough for planarization and wetting, but thin enough to allow insignificant material flow. A good In film thickness is around 2–2.5 μm. Next, one of the lasing elements is brought into close proximity with the indium layer on the spacer and aligned. Then, using visual observation, the temperature of the spacer is raised above the melting temperature of the indium solder and the lasing element is pressed into place using a vacuum collet. The vacuum is then released, but physical pressure with the collet is maintained. The heating source is then turned off and a cooling nitrogen gas stream is applied to the lasing element. When the solder has solidified the pressure on the lasing element is released. Cooling to room temperature then continues. The remaining lasing elements are soldered into place in a similar way.

The soldering procedure described above can be modified to fit the particular application and materials. However, in all cases surface preparation should be performed carefully to ensure good, reliable thermal and electrical connections.

From the foregoing, numerous modifications and variations of the principles of the present invention will be obvious to those skilled in its art. Therefore the scope of the present invention is to be defined by the appended claims.

What is claimed is:

1. A laser mounting spacer, comprising:
   a thermally conductive base; and
   a thermally conductive spacer protruding from said base and having a front surface which joins with at least two laser mounting surfaces to form at least two front edges such that a plane of said front surface forms oblique angles with planes of said laser mounting surfaces;
   wherein a width of said spacer controls the separation of said at least two laser mounting surfaces.

2. The spacer according to claim 1, wherein said spacer is electrically conductive.

3. The spacer according to claim 1, wherein an electrically conductive material is formed over said at least two laser mounting surfaces.

4. The spacer according to claim 1, wherein said at least two laser mounting surfaces are parallel.

5. The spacer according to claim 4, wherein said spacer is electrically conductive.

6. The spacer according to claim 5, wherein an electrically conductive material is formed over said at least two laser mounting surfaces.

7. An array of light emitting elements, comprising:

a thermally conductive base;

a thermally conductive spacer protruding from said base and having a front surface which joins with at least two mounting surfaces to form at least two front edges, and such that a plane of said front surface forms oblique angles with planes of said at least two mounting surfaces; and at least two light emitting elements of different wavelengths, each mounted on, and in thermal contact with, an associated one of said at least two mounting surfaces;

wherein a width of said spacer controls a separation of said laser mounting surfaces.

8. The array according to claim 7, wherein said light emitting elements are laser elements.

9. The array according to claim 7, wherein said at least two laser mounting surfaces are parallel.

10. The array according to claim 9, wherein said light emitting elements are laser elements.

11. A laser array, comprising:

a thermally conductive base;

a thermally conductive spacer protruding from said base and having a front surface which joins with at least two laser mounting surfaces to form at least two front edges such that a plane of said front surface forms oblique angles with planes of said at least two laser mounting surfaces; and at least two laser light emitting elements of different wavelengths, each mounted on, and in thermal contact with, an associated one of said at least two laser mounting surfaces such that said laser light emitting elements are each mounted adjacent an associated front edge;

wherein a width of said spacer controls a separation of said at least two laser mounting surfaces.

12. The array according to claim 11, wherein said at least two laser mounting surfaces are parallel.

13. An apparatus having an image plane, comprising:

a laser array having:

a thermally conductive base;

a thermally conductive spacer protruding from said base and having a front surface which joins with at least two laser mounting surfaces to form at least two front edges such that a plane of said front surface forms oblique angles with planes of said laser mounting surfaces; and at least two laser light emitting elements which emit laser beams of dissimilar wavelengths, each of said at least two laser light emitting elements mounted on, and in thermal contact with, an associated one of said at least two surfaces such that the front of each of said laser light emitting elements is adjacent a front edge; and a wavelength dependent optical system receiving the laser light beams from said at least two laser light emitting elements, said optical system directing said laser light beams onto the image plane;

wherein said oblique angle is such that the laser light emitting elements are offset so as to compensate for the wavelength dependency of said optical system.

14. The apparatus of claim 13, wherein said apparatus is a xerographic printer.

15. The apparatus of claim 14, wherein said wavelength dependent optical system includes a polygon raster output scanner.

16. The apparatus of claim 13, wherein said at least two laser mounting surfaces are parallel.

17. The apparatus of claim 16, wherein said wavelength dependent optical system includes a polygon raster output scanner.

18. The apparatus of claim 17, wherein said apparatus is a xerographic printer.

* * * * *